(12) United States Patent
Shin

(10) Patent No.: US 12,477,656 B2
(45) Date of Patent: Nov. 18, 2025

(54) PRINTED CIRCUIT BOARD AND METHOD OF MANUFACTURING THE SAME

(71) Applicant: SAMSUNG ELECTRO-MECHANICS CO., LTD., Suwon-si (KR)

(72) Inventor: Jae Ho Shin, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 163 days.

(21) Appl. No.: 18/101,660

(22) Filed: Jan. 26, 2023

(65) Prior Publication Data

US 2024/0155771 A1  May 9, 2024

(51) Int. Cl.
  H05K 1/18  (2006.01)
  H05K 1/02  (2006.01)
  H05K 1/11  (2006.01)

(52) U.S. Cl.
  CPC ........... *H05K 1/186* (2013.01); *H05K 1/0298* (2013.01); *H05K 1/115* (2013.01); *H05K 1/116* (2013.01); *H05K 1/185* (2013.01); *H05K 2201/096* (2013.01)

(58) Field of Classification Search
  CPC ............ H05K 1/186; H05K 1/0298; H05K 2201/096; H05K 1/185; H05K 1/188; H05K 2201/098; H05K 1/115; H05K 1/116; H05K 2201/10015; H05K 2201/10636; H05K 1/111
  See application file for complete search history.

(56) References Cited

U.S. PATENT DOCUMENTS

| | | | |
|---|---|---|---|
| 2008/0196931 A1* | 8/2008 | Lee | H01L 23/5389 29/830 |
| 2009/0205859 A1 | 8/2009 | Tanaka et al. | |
| 2017/0231094 A1 | 8/2017 | Blackshear et al. | |
| 2020/0091063 A1 | 3/2020 | Chen et al. | |
| 2020/0091104 A1* | 3/2020 | Takada | H05K 3/4647 |
| 2021/0327796 A1* | 10/2021 | Chen | H05K 3/4644 |

FOREIGN PATENT DOCUMENTS

| | | |
|---|---|---|
| JP | 2009-194381 A | 8/2009 |
| JP | 2017-143254 A | 8/2017 |

* cited by examiner

*Primary Examiner* — Steven T Sawyer
(74) *Attorney, Agent, or Firm* — Morgan Lewis & Bockius LLP

(57) ABSTRACT

A printed circuit board and a method of manufacturing the same are disclosed. The printed circuit board includes: a first core layer including a first insulating layer and a first core; a second core layer including a second insulating layer and a second core; a first element embedded in the first core; a second element embedded in the second core; a first pad and a second pad disposed on the first core layer and connected to the first element; a third pad and a fourth pad disposed on the second core layer and connected to the second element; and first connection layers interposed between one surface of the first core layer and one surface of the second core layer. The first pad and the third pad contact each other, and the first connection layers include at least one material of $SiO_2$, SiN, and SiCN.

20 Claims, 12 Drawing Sheets

PRINTED CIRCUIT BOARD AND METHOD OF MANUFACTURING THE SAME

CROSS-REFERENCE TO RELATED APPLICATION(S)

This application claims benefit of priority to Korean Patent Application No. 10-2022-0147167 filed on Nov. 7, 2022 in the Korean Intellectual Property Office, the disclosure of which is incorporated herein by reference in its entirety.

TECHNICAL FIELD

The present disclosure relates to a printed circuit board and a method of manufacturing the same.

BACKGROUND

For data processing, the amount of which has increased exponentially in accordance with the recent development of artificial intelligence (AI) technology or the like, a multi-chip package is used, the multi-chip package including a memory chip such as a high bandwidth memory (HBM), a processor chip such as a central processing unit (CPU), a graphics processing unit (GPU), an application specific integrated circuit (ASIC), or a field programmable gate array (FPGA), and the like. In addition, a board has a structure including various electronic components for driving the chips. Regarding the board structure in which various chips and electronic components are embedded in the board, research continues to reduce a thickness of the board, simplify and diversify connection and signal paths, and improve reliability.

SUMMARY

An aspect of the present disclosure may provide a printed circuit board having a signal path in various ways for connection between electronic components or the like embedded in the printed circuit board, and a method of manufacturing the same.

Another aspect of the present disclosure may provide a printed circuit board in which a plurality of elements are embedded, and a method of manufacturing the same.

Another aspect of the present disclosure may provide a printed circuit board having improved reliability, and a method of manufacturing the same.

According to an aspect of the present disclosure, a printed circuit board may include: a first core layer including a first insulating layer and a first core; a second core layer including a second insulating layer and a second core; a first element embedded in the first core; a second element embedded in the second core; a first pad and a second pad disposed on the first core layer and connected to the first element; a third pad and a fourth pad disposed on the second core layer and connected to the second element; and first connection layers interposed between one surface of the first core layer and one surface of the second core layer. The first pad and the third pad may contact each other, and the first connection layers may include at least one material of $SiO_2$, SiN, and SiCN.

According to another aspect of the present disclosure, a method of manufacturing a printed circuit board may include: forming cavities in a plurality of cores, respectively; embedding elements in the cavities through insulating layers; forming pads connected to the elements on the insulating layers; forming connection layers in such a manner that one surfaces of the pads are exposed while covering the insulating layers and the pads; and connecting the plurality of cores to each other in such a manner that the exposed one surfaces of the pads contact each other. The connection layers may include at least one material of $SiO_2$, SiN, and SiCN.

According to another aspect of the present disclosure, a printed circuit board may include: a first core layer including a first insulating layer and a first core; a second core layer including a second insulating layer and a second core; a first passive component disposed in the first core and covered by the first insulating layer; a second passive component disposed in the second core and covered by the second insulating layer; and a connection pad disposed between the first passive component and the second passive component, connected to the first passive component through a first via extending in the first insulating layer from the connection pad to the first passive component, and connected to the second passive component through a second via extending in the second insulating layer from the connection pad to the second passive component.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments of the present disclosure will be described in detail with reference to the accompanying drawings.

Electronic Device

Figure 1:
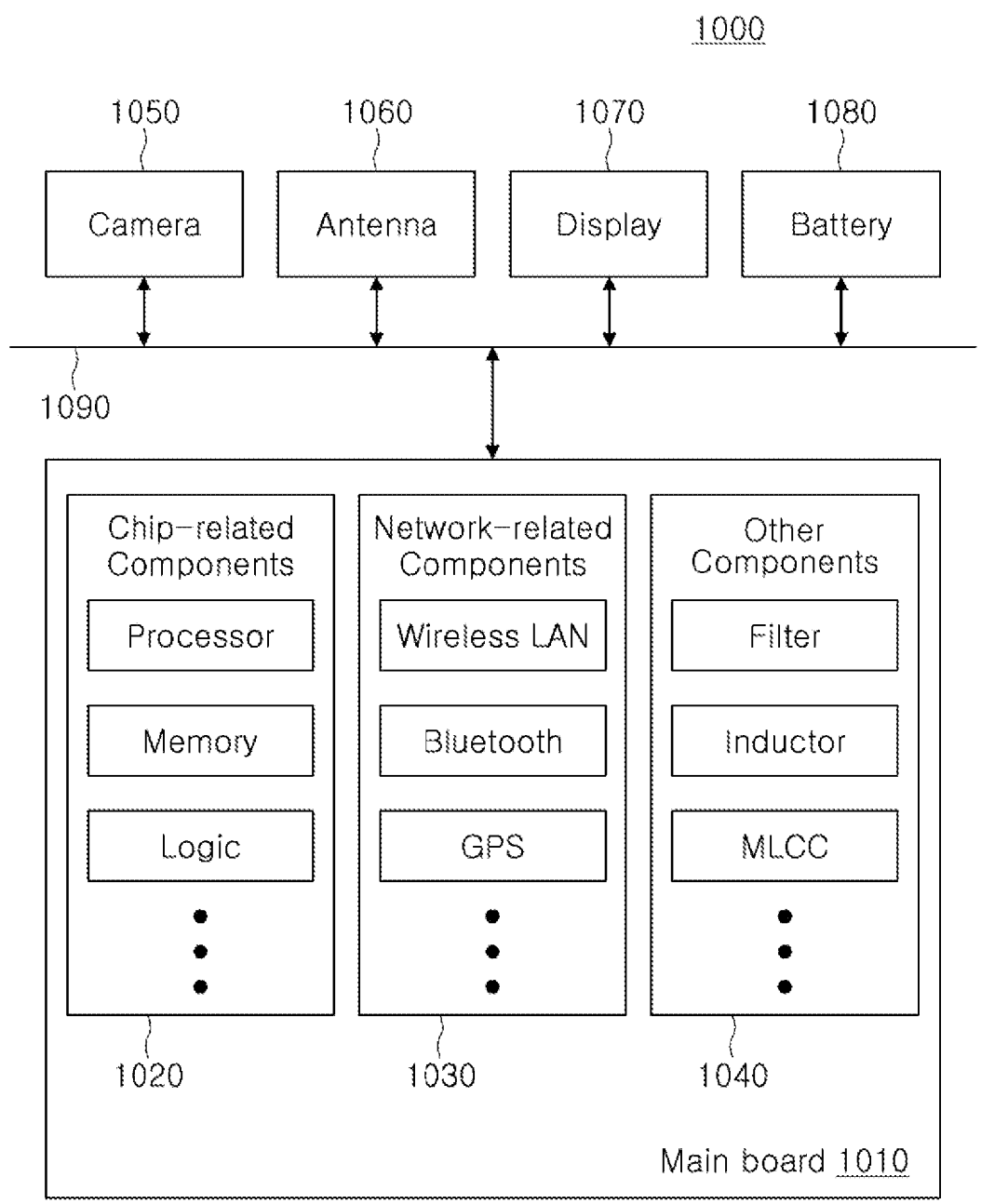
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. Chip-related components 1020, network-related components 1030, and other components 1040 may be physically and/or electrically connected to the mainboard 1010. These components may be connected to other electronic components to be described below to form various signal lines 1090.

The chip-related components 1020 may include a memory chip such as a volatile memory (e.g., a dynamic random access memory (DRAM)), a non-volatile memory (e.g., a read only memory (ROM)), or a flash memory; an application processor chip such as a central processor (e.g., a central processing unit (CPU)), a graphics processor (e.g., a graphics processing unit (GPU)), a digital signal processor, a cryptographic processor, a microprocessor, or a microcontroller; a logic chip such as an analog-to-digital converter or an application-specific integrated circuit (ASIC); and the like. The chip-related components 1020 are not limited thereto, and may also include other types of chip-related electronic components. In addition, the chip-related components 1020 may be combined with each other. The chip-related components 1020 may be in the form of a package including the chips or electronic components described above.

The network-related components 1030 may include protocols such as wireless fidelity (Wi-Fi) (Institute of Electrical and Electronics Engineers (IEEE) 802.11 family or the like), worldwide interoperability for microwave access (WiMAX) (IEEE 802.16 family or the like), IEEE 802.20, long term evolution (LTE), evolution data only (Ev-DO), high speed packet access+(HSPA+), high speed downlink packet access+(HSDPA+), high speed uplink packet access+ (HSUPA+), global system for mobile communications (GSM), enhanced data GSM environment (EDGE), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols. However, the network-related components 1030 are not limited thereto, and may also include a variety of other wireless or wired standards or protocols. In addition, the network-related components 1030 may be combined with each other, together with the chip-related components 1020.

The other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, the other components 1040 are not limited thereto, and also include passive elements in chip component type used for various other purposes, and the like. In addition, the other components 1040 may be combined with each other, together with the chip-related components 1020 and/or the network-related components 1030.

Depending on the type of electronic device 1000, the electronic device 1000 may include other electronic components that may or may not be physically and/or electrically connected to the mainboard 1010. Examples of the other electronic components may include a camera 1050, an antenna 1060, a display 1070, a battery 1080, and the like. The other electronic components are not limited thereto, and may be an audio codec, a video codec, a power amplifier, a compass, an accelerometer, a gyroscope, a speaker, a mass storage unit (e.g., a hard disk drive), a compact disk (CD), a digital versatile disk (DVD), and the like. The other electronic components may also include other electronic components and the like used for various purposes depending on the type of electronic device 1000.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
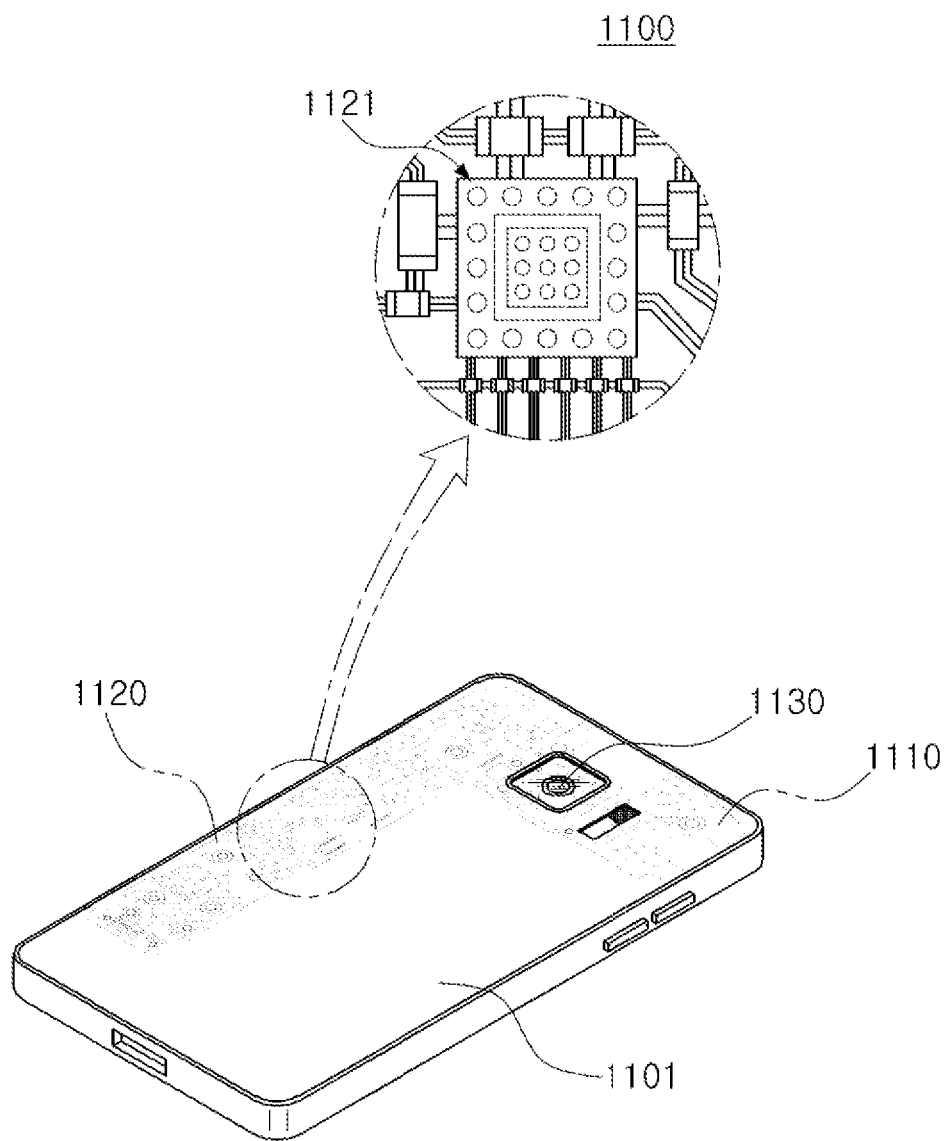
FIG. 2 is a schematic perspective view illustrating an exemplary embodiment of an electronic device.

FIG. 2 is a schematic perspective view illustrating an example of an electronic device.

Referring to FIG. 2, the electronic device may be, for example, a smartphone 1100. A motherboard 1110 may be accommodated in the smartphone 1100, and various components 1120 may be physically and/or electrically connected to the motherboard 1110. Also, other components that may or may not be physically and/or electrically connected to the motherboard 1110, such as a camera module 1130 and/or a speaker 1140, may be accommodated in the smartphone 1100. Some of the components 1120 may be the above-described chip-related components, e.g., a component package 1121, but are not limited thereto. The component package 1121 may be in the form of a printed circuit board on which electronic components including active components and/or passive components are surface-mounted. Alternatively, the component package 1121 may be in the form of a printed circuit board in which active components and/or passive components are embedded. Meanwhile, the electronic device is not necessarily limited to the smartphone 1100, and may be any other electronic device as described above.

Printed Circuit Board

Figure 3:
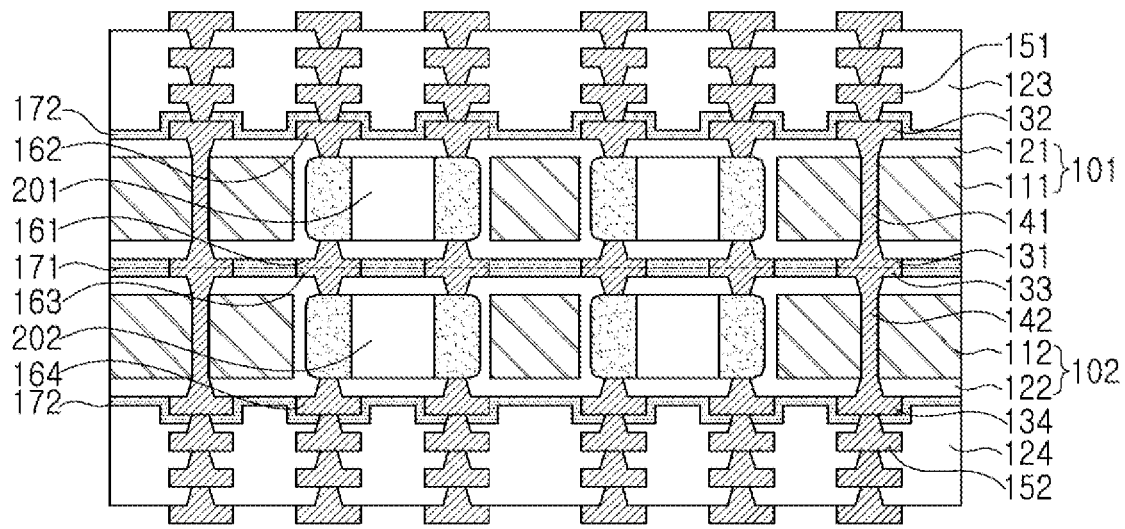
FIG. 3 is a schematic cross-sectional view illustrating a printed circuit board according to an exemplary embodiment.

FIG. 3 is a schematic cross-sectional view illustrating a printed circuit board according to an exemplary embodiment.

Referring to FIG. 3, a printed circuit board according to an exemplary embodiment may include a first core layer 101 including a first insulating layer 121 and a first core 111, a second core layer 102 including a second insulating layer 122 and a second core 112, a first element 201 embedded in the first core 111, a second element 202 embedded in the second core 112, a first pad 161 and a second pad 162 disposed on the first core layer 101 and electrically connected to the first element 201, a third pad 163 and a fourth pad 164 disposed on the second core layer 102 and electrically connected to the second element 202, and first connection layers 171 interposed between one surface of the first core layer 101 and one surface of the second core layer 102, the first pad 161 and the third pad 163 may contact each other to be electrically connected to each other, and the first connection layers 171 may include one or more materials among SiO2, SiN, and SiCN.

The first core layer 101 may be constituted by the first insulating layer 121 and the first core 111, and the second core layer 102 may be constituted by the second insulating layer 122 and the second core 112. The first core 111 and the second core 112 may include an insulating material. The insulating material may include a thermosetting resin such as an epoxy resin, a thermoplastic resin such as a polyimide, or a material containing an inorganic filler, an organic filler, and/or a glass fiber, a glass cloth and/or a glass fabric together with the thermosetting or thermoplastic resin. The insulating material may be a photosensitive material and/or a non-photosensitive material. Examples of the insulating material may include, but are not limited to, solder resist (SR), Ajinomoto build-up film (ABF), FR-4, bismaleimide triazine (BT), prepreg (PPG), resin coated copper (RCC), and copper clad laminate (CCL). Alternatively, another type of polymer material may be used as an insulating material. In addition, the first core 111 may be a so-called glass core, which is a core including a glass material. In addition, the first core 111 may be a pure glass core only including a glass material. Meanwhile, in a case where the first core 111 includes a glass core, this may be advantageous in controlling the warpage characteristics of the printed circuit board. In particular, in order to achieve a high-performance printed circuit board including a core in which a plurality of elements are embedded, the printed circuit board according to an exemplary embodiment may use a glass core in the first core 111. As will be described below, since the printed circuit board according to an exemplary embodiment has a structure in which a plurality of thin cores are stacked, it is possible to prevent a crack which occurs in a general glass core. Since the core unit of the printed circuit board is formed by stacking the first core 111 and the second core 112 in a vertical direction, each of the first core 111 and the second core 112 may be thinner than in a core used in a general printed circuit board, but is not limited thereto. If necessary, the first core 111 and the second core 112 each having a thickness similar to that of a core used in a general printed circuit board may be stacked.

The first insulating layer 121 and the second insulating layer 122 may also include an insulating material. The first insulating layer 121 and the second insulating layer 122 may include the same materials as the first core 111 and the second core 112, respectively, but are not limited thereto. The first insulating layer 121 and the second insulating layer 122 may include different materials from the first core 111 and the second core 112, respectively.

The first element 201 and the second element 202 may be embedded in the first core layer 101 and the second core layer 102, respectively. Each of the first element 201 and the second element 202 may be one of various types of electronic components. For example, each of the first element 201 and the second element 202 may be one of various types of active components and/or passive components. The active component may be one of various types of integrated circuit (IC) dies in which hundreds to millions or more of elements are integrated into a single chip. Examples of the passive component may include a chip-type capacitor such as a multilayer ceramic capacitor (MLCC) and a chip-type inductor such as a power inductor (PI). However, the active components and/or the passive components are not limited thereto, and other types of active components and/or passive components may be arranged for the first element 201 and the second element 202.

Meanwhile, a plurality of first elements 201 and a plurality of second elements 202 may be included. That is, a plurality of first elements 201 may be embedded in the first core layer 101, and a plurality of second elements 202 may be embedded in the second core layer 102. Although it is illustrated in FIG. 3 that the number of first elements 201 is two and the number of second elements 202 is two, the number of first elements 201 and the number of second elements may be more than or less than two. Also, the number of first elements 201 and the number of second elements 202 do not need to be the same, and the number of first elements 201 and the number of second elements 202 may be appropriately adjusted if necessary.

The first element 201 may be electrically connected to the first pad 161 and the second pad 162 disposed on one surface of the first core layer 101 and the other surface of the first core layer 101 opposite thereto, respectively. In addition, the second element 202 may be electrically connected to the third pad 163 and the fourth pad 164 disposed on one surface of the second core layer 102 and the other surface of the second core layer 102 opposite thereto, respectively. The first to fourth pads 161 to 164 may be means for electrically connecting the first element 201 and the second element 202 to other components of the board, and the first pad 161 and the third pad 163 may be connected to each other to directly connect the first element 201 and the second element 202 to each other.

The first to fourth pads 161 to 164 may include a metal material.

The metal material may include copper (Cu), aluminum (Al), silver (Ag), tin (Sn), gold (Au), nickel (Ni), lead (Pb), titanium (Ti), and/or an alloy thereof, preferably copper (Cu), but is not limited thereto.

The first insulating layer 121 may have a general circuit pattern, and may perform various functions depending on design, such as a function for mounting a component thereon. The first insulating layer 121 may be formed by any one of a semi-additive process (SAP), a modified semi-additive process (MSAP), a tenting (TT) process, and a subtractive process, but is not limited thereto.

The first element 201 and the second element 202 may be electrically connected to the first to fourth pads 161 to 164 by respective vias. The vias may include the same metal material as the first to fourth pads 161 to 164, and may be formed simultaneously with the first to fourth pads 161 to 164, but are not limited thereto. After the vias are formed first, the first to fourth pads 161 to 164 may be formed.

The first pad 161 disposed on one surface of the first core layer 101 and the third pad 163 disposed on one surface of the second core layer 102 may contact each other to be electrically connected to each other. That is, the first element 201 and the second element 202 may be electrically connected to each other through the first pad 161 and the third pad 163, and in this case, the first element 201 and the second element 202 may be connected to each other through a shortest path, while being embedded in the first core layer 101 and the second core layer 102, respectively. In a conventional method in which electronic components are mounted on a plurality of core layers, it is essential to bypass a signal path by connecting the signal path onto the core layers because electronic components are not electrically connected to each other in a direct manner. In contrast, in the printed circuit board according to an exemplary embodiment, since the elements embedded in the plurality of thin core layers, respectively, can be directly connected to each other through the pads, it is possible to simplify a connection path between the elements, and it is also possible to secure various paths. Therefore, since various signal paths can be secured while having a structure in which a plurality of electronic components are embedded in each of a plurality of thin cores, it is possible to reduce a thickness of the core, and it is also possible to secure reliability while a large number of electronic components can be embedded with a limited total thickness of cores.

The first pad 161 may have a smaller thickness than the second pad 162. Also, the third pad 163 may have a smaller thickness than the fourth pad 164. A thickness of a certain component refers to an average vertical distance from one surface of the component to the other surface of the component facing the one surface, and is an approximate concept that may include errors occurring in a measurement process and a manufacturing process. As will be described below, in the method of manufacturing a printed circuit board, after forming the connection layers on the core layers, since the connection layers may be partially removed through a grinding process, the first pad 161 and the third pad 163 to be connected to each other may be partially removed accordingly. Therefore, the first pad 161 may be thinner than the second pad 162, and the third pad 163 may be thinner than the fourth pad 164. However, the thickness of the first pad 161 does not need to be smaller than the thickness of the second pad 162. In a case where, among manufacturing processes, the grinding process is performed in such a manner that none of the first pad 161 is removed, the first pad 161 may have substantially the same thickness as the second pad 162. Alternatively, considering that the first pad 161 will be partially removed, the first pad 161 may be formed to have a greater thickness than the second pad 162. The same may be applied to the third pad 163 and the fourth pad 164.

The printed circuit board according to an exemplary embodiment may include first connection layers 171 disposed between one surface of the first core layer 101 and one surface of the second core layer 102. The first connection layers 171 may include an insulating material, and the insulating material may be a compound containing Si. For example, the first connection layers 171 may include one or more materials of $SiO_2$, SiN, SiCN, and the like, but are not limited thereto, and various materials may be used for the first connection layers 171. The first connection layers 171 may be insulating layers including one or more materials of $SiO_2$, SiN, SiCN, and the like, and the first connection layer 171 of the first core layer 101 and the first connection layer 171 of the second core layer 102 may be combined to each other to be integrally formed. That is, the first core layer 101 and the second core layer 102 may be bonded to each other by so-called hybrid bonding. The hybrid bonding may be used as a technique for stacking chips, and means that chemical bonding and physical bonding are performed by arranging two components to be connected to each other and adjusting a temperature. By setting temperature conditions for expanding the metal material, increasing a size of a grain boundary, or the like, the first pad 161 and the third pad 163 may be connected to each other, and the first connection layers 171 may also be combined to each other in the same step. That is, through the hybrid bonding, the unit core layers, in which the respective elements are embedded, may be combined to each other in the vertical direction, and the elements may be electrically connected to each other through the pads directly connected to each other. That is, the first connection layers 171 may include one or more of the above-described materials, but are not limited thereto, and may include any material capable of performing hybrid bonding. Here, although it is described that the material of the first connection layers 171 includes one or more of $SiO_2$, SiN, and SiCN, this is merely an example. This similarly applies to what will be described below. A boundary between the first connection layer 171 disposed on the first core layer 101 and the first connection layer 171 disposed on the second core layer 102 may be identified, but the boundary does not need to be clearly identified. If the first connection layer 171 of the first core layer 101 and the first connection layer 171 of the second core layer 102 are integrally formed, and the first pad 161 and the third pad 163 are integrally formed, the boundary may not be identified.

Since the first connection layers 171 are formed along one surface of the first core layer 101 and one surface of the second core layer 102, respectively, the first pad 161 and the third pad 163 connecting the first element 201 and the second element 202 to each other may be embedded in the first connection layers 171. The first pad 161 and the third pad 163 being embedded in the first connection layers 171 means that a side surface of the first pad 161 and a side surface of the third pad 163 may be covered by the first connection layers 171, while one surface of the first pad 161 and one surface of the third pad 163 contact each other to be connected to each other, but is not limited thereto. The first pad 161 and the third pad 163 being embedded in the first connection layers 171 may mean that even if one surface of the first pad 161 and one surface of the third pad 163 are not exactly aligned with each other, the misaligned portions are covered by the first connection layers 171. That is, portions of the first pad 161 and the third pad 163 that are not connected to each other may be covered by the first connection layers 171.

The printed circuit board according to an exemplary embodiment may include second connection layers 172 disposed on the other surface of the first core layer 101 and the other surface of the second core layer 102, respectively. The second connection layer 172 disposed on the other surface of the first core layer 101 may cover the first insulating layer 121 and the second pad 162, and the second connection layer 172 disposed on the other surface of the second core layer 102 may cover the second insulating layer 122 and the fourth pad 164. The second connection layers 172 may include the same material as the first connection layers. For example, the second connection layers 172 may include one or more materials of $SiO_2$, SiN, and SiCN, but is not limited thereto. Any material usable for the first connection layers 171 as described above may also be used for the second connection layers 172. In the step of forming the first connection layers 171, the second connection layers 172 may be further formed on the other surfaces of the first core layer 101 and the second core layer 102, respectively. The second connection layers 172 may be formed on the other surfaces of the first core layer 101 and the second core layer 102 to be connected to a third insulating layer 123 and a fourth insulating layer 124, respectively. Meanwhile, it is illustrated in FIG. 3 that the number of core layers is two, but the number of core layers is not limited thereto. In a case where the number of core layers is more than two, the core layers may be connected to each other through connection layers.

The printed circuit board according to an exemplary embodiment may further include a first pattern 131 and a second pattern 132 disposed on one surface and the other surface of the first core layer 101, respectively, and a third pattern 133 and a fourth pattern 134 disposed on one surface and the other surface of the second core layer 102, respectively.

The first to fourth patterns 131 to 134 may be disposed on the first core layer 101 and the second core layer 102 to transmit signals in the printed circuit board. A plurality of first patterns, a plurality of second patterns, a plurality of third patterns, and a plurality of fourth patterns may be included, and the first to fourth patterns 131 to 134 may include the same metal material as the first to fourth pads 161 to 164. The first to fourth patterns 131 to 134 may be formed in the same step as the first to fourth pads 161 to 164, but are not limited thereto, and the first to fourth patterns 131 to 134 and the first to fourth pads 161 to 164 may be formed in a stepwise manner.

The first pattern 131 disposed on one surface of the first core layer 101 and the third pattern 133 disposed on one surface of the second core layer 102 may contact each other to be electrically connected to each other. The first pattern 131 and the third pattern 133 contacting each other to be electrically connected to each other is the same as the first pad 161 and the third pad 163 contacting each other to be electrically connected to each other. Also, the first pattern 131 and the third pattern 133 may be embedded in the first connection layers 171, and this is the same as the first pad 161 and the third pad 163 being embedded in the first connection layers 171.

The printed circuit board according to an exemplary embodiment may further include a first via 141 and a second via 142. The first via 141 may penetrate through the first core layer 101 to connect the first pattern 131 and the second pattern 132 to each other, and the second via 142 may penetrate through the second core layer 102 to connect the third pattern 133 and the fourth pattern 134 to each other. The first via 141 may penetrate through the first core 111 and the first insulating layer 121 of the first core layer 101, and the second via 142 may penetrate through the second core 112 and the second insulating layer 122 of the second core layer 102. The first via 141 and the second via 142 may include a metal material, and may include the same material as the first to fourth patterns 131 to 134. The first via 141 and the second via 142 may be manufactured in the same step as the first to fourth patterns 131 to 134, but are not limited thereto, and the first and second vias 141 and 142 and the first to fourth patterns 131 to 134 may be formed in a stepwise manner.

The printed circuit board according to an exemplary embodiment may further include a third insulating layer 123, and a fourth insulating layer 124, a first circuit layer 151, and a second circuit layer 152.

The third insulating layer 123 may be an insulating layer disposed on the other surface of the first core layer 101, and the fourth insulating layer 124 may be an insulating layer disposed on the other surface of the second core layer 102. Each of the third insulating layer 123 and the fourth insulating layer 124 may include an insulating material, and may include the same material as the first insulating layer 121 and the second insulating layer 122. Although it is illustrated in FIG. 3 for simplification that each of the third insulating layer 123 and the fourth insulating layer 124 is in an integrally formed state, but a plurality of third insulating layers 123 and a plurality of fourth insulating layers 124 may be formed, and boundaries between the plurality of insulating layers may be expressed.

The first circuit layer 151 and the second circuit layer 152 may be disposed on the third insulating layer 123 and the fourth insulating layer 124, respectively. The first circuit layer 151 and the second circuit layer 152 may include a metal material, and may include the same metal material as the first to fourth patterns 131 to 134. Although it is illustrated in FIG. 3 that the number of first circuit layers and the number of second circuit layers are three, the number of first circuit layers and the number of second circuit layers may be more than or less than three. A plurality of first circuit layers 151 and a plurality of second circuit layers 152 may be included. The plurality of circuit layers may be connected or disconnected to or from each other to transmit a signal, and may also be electrically connected to the first to fourth pads 161 to 164 and the first to fourth patterns 131 to 134. Meanwhile, the printed circuit board according to an exemplary embodiment may further include vias connecting the plurality of first circuit layers 151 to each other and vias connecting the plurality of second circuit layers 152 to each other.

Meanwhile, although it is illustrated in FIG. 3 that the third insulating layer 123 and the fourth insulating layer 124 and the first circuit layer 151 and the second circuit layer 152 are symmetrical to each other, but are not limited thereto. The number of third insulating layers 123 and the number of fourth insulating layers 124 may be freely changed, and the number of first circuit layers 151 and the number of second circuit layers 152 may also be freely changed.

Meanwhile, the printed circuit board according to an exemplary embodiment may further include cavities, electronic components, and the like additionally formed in and on the third insulating layer 123 and the fourth insulating layer 124, may further include solder resists disposed on the outermost sides of the printed circuit board, and may further include pads, posts, and the like for mounting electronic components thereon. That is, the printed circuit board according to an exemplary embodiment is not limited to the configuration illustrated in FIG. 3, and may further include components that may be used by those skilled in the art as well as general components of printed circuit boards.

Figure 4:
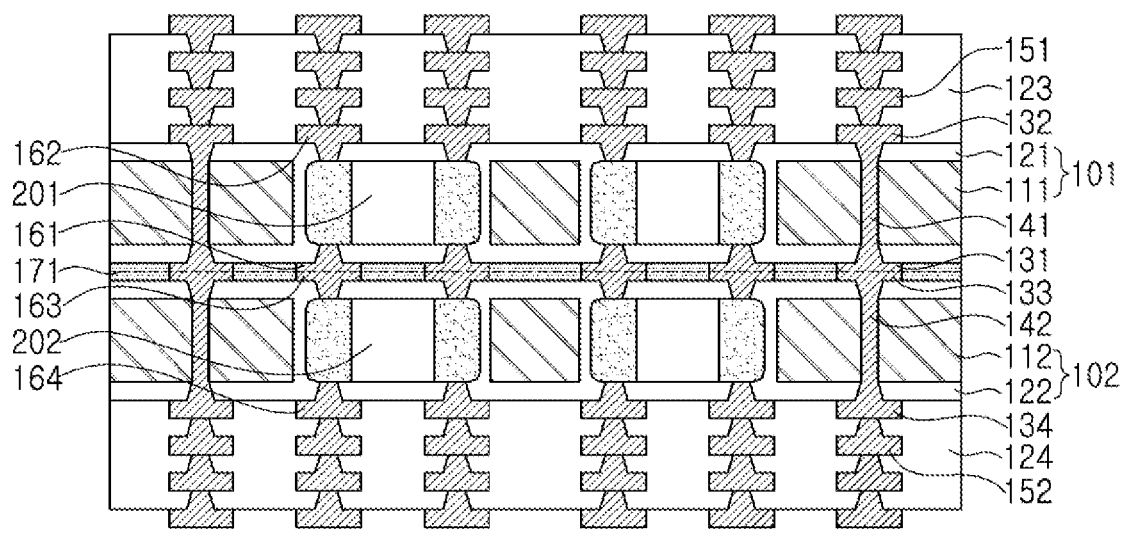
FIG. 4 is a schematic cross-sectional view illustrating a printed circuit board according to another exemplary embodiment.

FIG. 4 is a schematic cross-sectional view illustrating a printed circuit board according to another exemplary embodiment.

Referring to FIG. 4, the printed circuit board according to another exemplary embodiment may not include second connection layers 172. This may be achieved by not additionally forming second connection layers 172 in a step of forming first connection layers 171 in a method of manufacturing the printed circuit board according to another exemplary embodiment. Since the second connection layers 172 are not formed on the other surface of the first core layer 101 and the other surface of the second core layer 102, the other surface of the first core layer 101 and the other surface of the second core layer 102 may contact the third insulating layer 123 and the fourth insulating layer 124, respectively.

Meanwhile, although it is illustrated in FIG. 4 that the number of core layers is two, including the first core layer 101 and the second core layer 102, but is not limited thereto. The printed circuit board according to another exemplary embodiment may have a configuration in which three or more core layers are stacked. In this case, no connection layers may be formed on respective outward sides of the two outermost ones of the stacked core layers, while the first connection layers 171 are disposed to connect the core layers to each other.

Except that the second connection layers 172 are not formed, the configuration of the printed circuit board according to an exemplary embodiment may also be identically applied to the printed circuit board according to another exemplary embodiment. Therefore, the overlapping description thereof will not be repeated.

Figure 5:
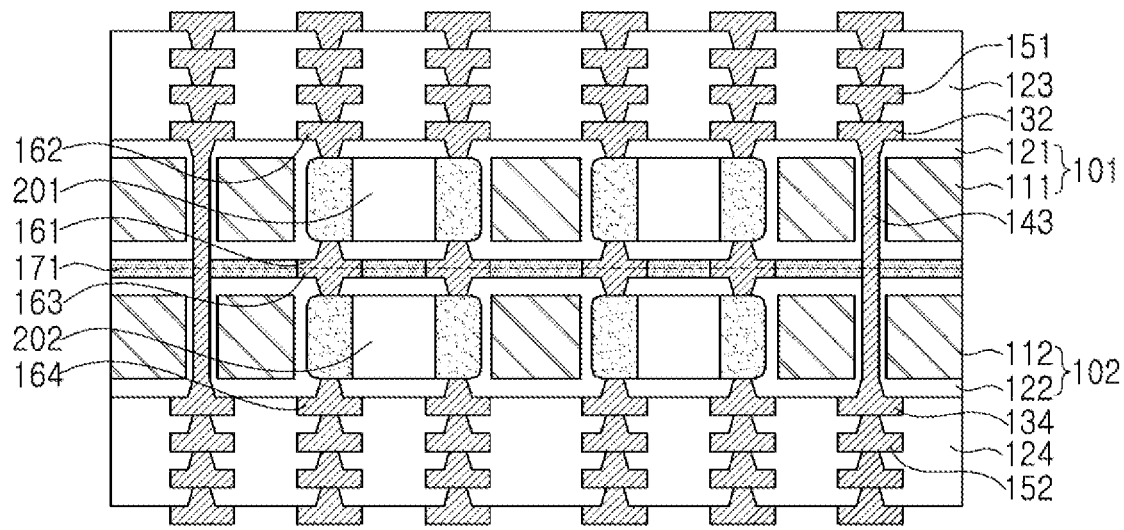
FIG. 5 is a schematic cross-sectional view illustrating a printed circuit board according to another exemplary embodiment.

FIG. 5 is a schematic cross-sectional view illustrating a printed circuit board according to another exemplary embodiment.

Referring to FIG. 5, the printed circuit board according to another exemplary embodiment may only include a second pattern 132 and a fourth pattern 134 disposed on the other surface of the first core layer 101 and the other surface of the second core layer 102, respectively, without including a first pattern 131 and a third pattern 133 disposed on one surface of the first core layer 101 and one surface of the second core layer 102, respectively.

Meanwhile, the printed circuit board according to another exemplary embodiment may further include a through via 143 connecting the second pattern 132 and the fourth pattern 134 to each other, and penetrating through the first core layer 101, the second core layer 102, and the first connection layers 171. The through via 143 of the printed circuit board according to another exemplary embodiment may be formed of the same material as the first via 141 and/or the second via 142 of the printed circuit board according to an exemplary embodiment. In a manufacturing step, through hole areas may be formed in advance at a place where the through via 143 is to be formed. Alternatively, after the first core layer 101 and the second core layer 102 are combined to each other by the first connection layers 171, a through hole may be formed to penetrate through all the first core layer 101, the second core layer 102, and the first connection layers 171 in a lump, and then the through via 143 may be formed in the through hole by plating. As described above for the printed circuit board according to an exemplary embodiment, in a case where any of the first core 111 and the second core 112 includes a glass core, in a step of manufacturing core layers, through hole areas may be formed in advance in areas where the through via 143 is to be formed. In this case, it is possible to prevent a warping or cracking phenomenon in a step of manufacturing a core, as compared with the case in which plurality of cores are stacked and then a through hole is formed to penetrate through all of the plurality of cores in a lump. The through hole areas may be formed in advance at the place where the through via 143 is to be formed, regardless of the materials of the first core 111 and the second core 112. In a case where the through hole areas are formed at the place where the through via 143 is to be formed in the step of manufacturing the first core layer 101 and the second core layer 102, a side surface of the through via 143 may be covered by the first insulating layer 121 and the second insulating layer 122, and the through via 143 may be spaced apart from the first core 111 and the second core 112.

Except the through via 143, the configuration of the printed circuit board according to an exemplary embodiment or the configuration of the printed circuit board according to another exemplary embodiment may also be identically applied to the printed circuit board according to another exemplary embodiment. Therefore, the overlapping description thereof will not be repeated.

Figure 6:
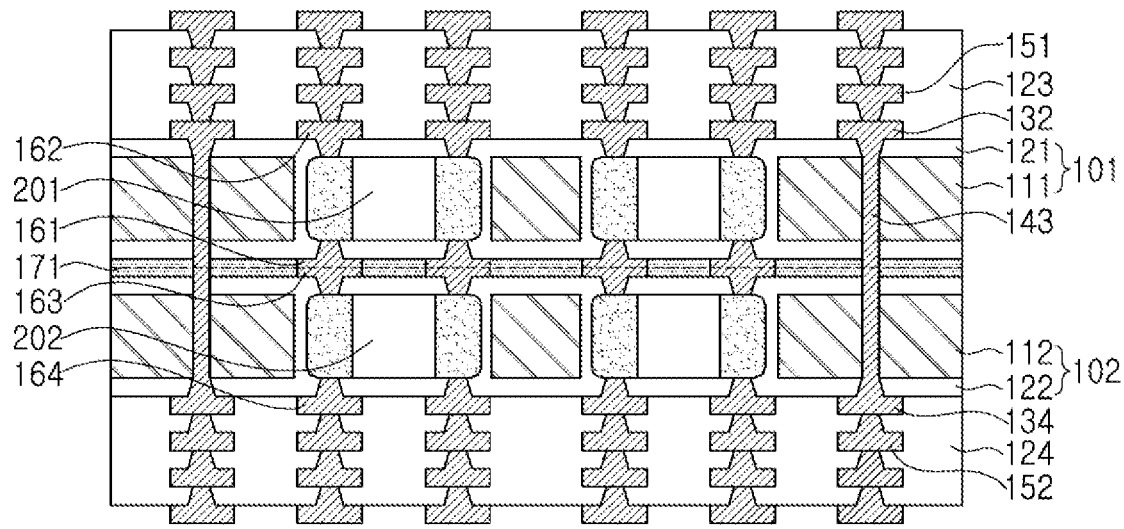
FIG. 6 is a schematic cross-sectional view illustrating a printed circuit board according to another exemplary embodiment.

FIG. 6 is a schematic cross-sectional view illustrating a printed circuit board according to another exemplary embodiment.

Referring to FIG. 6, the printed circuit board according to another exemplary embodiment may only include a second pattern 132 and a fourth pattern 134 disposed on the other surface of the first core layer 101 and the other surface of the second core layer 102, respectively, without including a first pattern 131 and a third pattern 133 disposed on one surface of the first core layer 101 and one surface of the second core layer 102, respectively.

Meanwhile, the printed circuit board according to another exemplary embodiment may include a through via 143 connecting the second pattern 132 and the fourth pattern 134 to each other, and penetrating through all of the first core layer 101, the second core layer 102, and the first connection layers 171 in a lump. In the printed circuit board according to another exemplary embodiment, since the through via 143 is formed after the first core layer 101 and the second core layer 102 are connected to each other by the first connection layers 171, a side surface of the through via 143 may contact the first core 111 and the second core 112. This structure is available when none of the first core 111 and the second core 112 includes a glass core, and a through hole penetrating through both the first core layer 101 and the second core layer 102 in a lump after the first core layer 101 and the second core layer 102 are combined to each other. Therefore, the through via 143 can be formed without forming through holes in the core layers in advance at a place corresponding to the through via in the step of manufacturing the core layers.

Except the through via 143, the configuration of the printed circuit board according to an exemplary embodiment, the configuration of the printed circuit board according to another exemplary embodiment, or the configuration of the printed circuit board according to another exemplary embodiment may also be identically applied to the printed circuit board according to another exemplary embodiment. Therefore, the overlapping description thereof will not be repeated.

Method of Manufacturing Printed Circuit Board

Figure 7A:
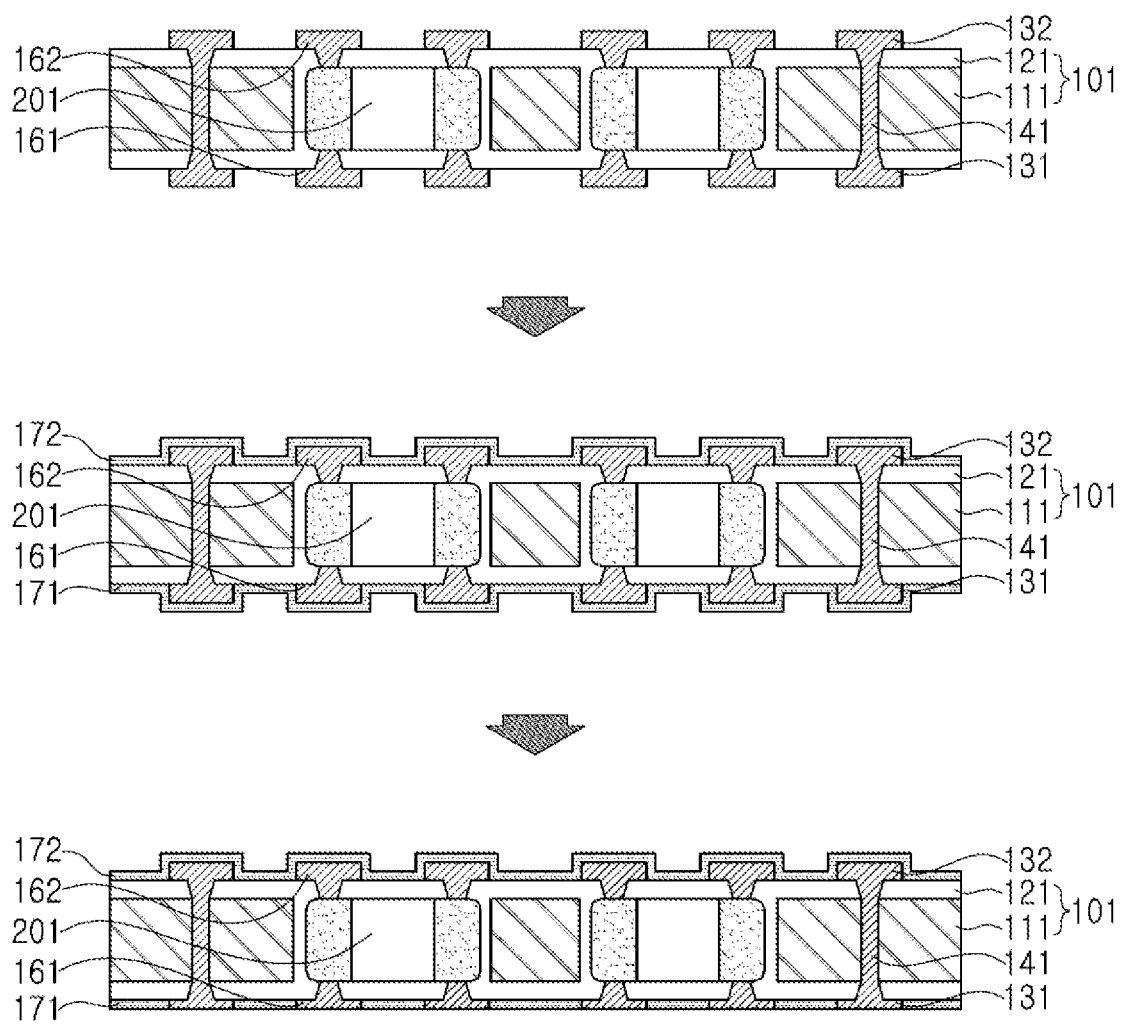
FIGS. 7A and 7B are schematic cross-sectional views illustrating a method of manufacturing the printed circuit board according to an exemplary embodiment.
Figure 7B:
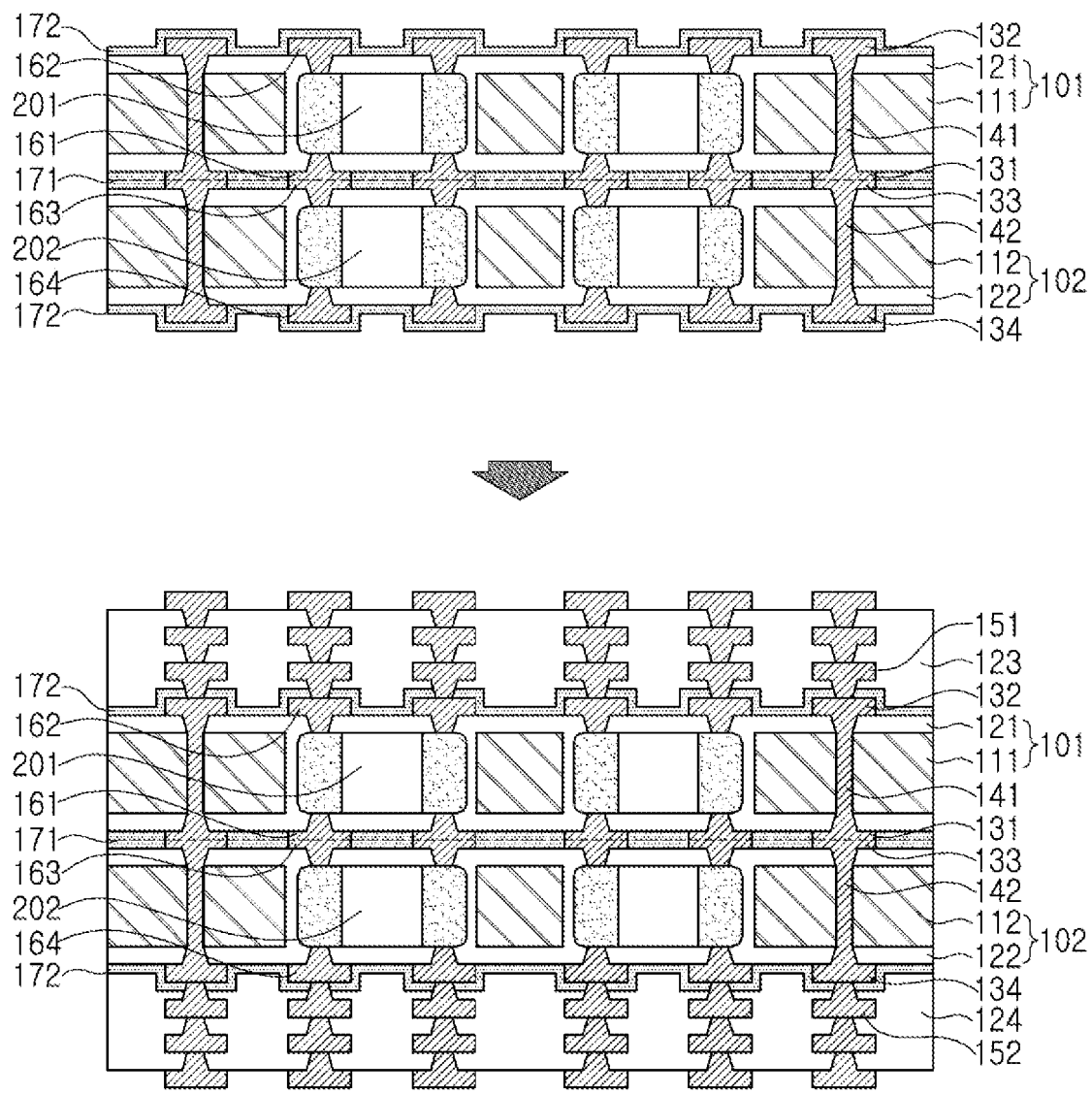

FIGS. 7A and 7B are schematic cross-sectional views illustrating a method of manufacturing the printed circuit board according to an exemplary embodiment.

Referring to FIG. 7A, in the printed circuit board according to an exemplary embodiment, a unit core layer may be manufactured first. For convenience of description, only the first core layer will be described, and the same may also be applied to the second core layer unless otherwise specified. If the printed circuit board includes a plurality of unit core layers, the same may also be applied to the plurality of unit core layers.

First of all, a cavity may be formed in the first core 111 to embed the first element 201 therein, and the first pad 161, the second pad 162, the first pattern 131, the second pattern 132, and the first via 141 may be formed. The step of forming the cavity in the first core 111 may be performed in a drilling manner using a mechanical drill or a laser drill, but is not particularly limited thereto. After the first element 201 is fixed onto the cavity formed in the first core 111 using a temporary adhesive layer, the first element 201 may be embedded using the first insulating layer 121. Thereafter, the first pad 161 and the second pad 162 may be formed together with vias connected to the first element 201, and the first via 141 penetrating through the first core layer 101, the first pattern 131, and the second pattern 132 may be formed.

Thereafter, the first connection layer 171 may be formed on one surface of the first core layer 101, and the second connection layer 172 may be formed on the other surface of the first core layer 101.

The first connection layer 171 and the second connection layers 172 may be formed simultaneously, but are not limited thereto. The second connection layers 172 may be formed after the first connection layer 171 is formed. As described above for the printed circuit board according to an exemplary embodiment, the first connection layer 171 may be formed of an insulating material including one or more materials of $SiO_2$, SiN, SiCN, and the like. The first connection layer 171 may be disposed on one surface of the first insulating layer 121, and may be formed to extend along one surface of the first insulating layer 121 and borders of the first pad 161 and the first pattern 131. The second connection layer 172 may be formed to extend along the other surface of the first insulating layer 121 and borders of the second pad 162 and the second pattern 132. That is, the first connection layer 171 may cover the first insulating layer 121, the first pad 161, and the first pattern 131, and the second connection layer 172 may cover the first insulating layer 121, the second pad 162, and the second pattern 132.

Thereafter, the first connection layer 171 may be at least partially removed to expose one surfaces of the first pad 161 and the first pattern 131 to the outside. In this case, the step of at least partially removing the first connection layer 171 may be performed using a mechanical grinding method or a chemical-mechanical polishing (CMP) method, but is not limited thereto.

Referring to FIG. 7B, first, the first core layer 101 and the second core layer 102 may be connected to each other in such a manner that one surface of the first core layer 101 and one surface of the second core layer 102 face each other. In this case, in order to connect the first core layer 101 and the second core layer to each other, the first pad 161 and the third pad 163 may be bonded to each other in such a manner that the exposed one surface of the first pad 161 disposed on one surface of the first core layer 101 and the exposed one surface of the third pad 163 disposed on one surface of the second core layer 102 contact each other, and then a thermal annealing process may be performed. The thermal annealing process may be performed through two stages, but is not limited thereto. The thermal annealing process may be performed through more than two stages, or may be performed at a specific temperature at a time. In the first stage of the thermal annealing process, a chemical bond may be formed between the respective first connection layers 171 of the first core layer 101 and the second core layer 102. Thereafter, in the second stage of the thermal annealing process, the first pad 161 and the third pad 163 may expand and the first pattern 131 and the third pattern 133 may expand, causing the growth of grain boundaries, so that the upper and lower components are physically connected to each other for electrical connection therebetween. The second stage of the thermal annealing process may be performed at a higher temperature than the first stage of the thermal annealing process, but is not limited thereto. The first core layer 101 and the second core layer 102 may be connected by the first connection layers 171, and a boundary may appear at a portion where the first connection layers 171 are combined to each other. However, the boundary between the first connection layers 171 combined to each other may not appear apparently. Since the first connection layer 171 disposed on the first core layer 101 and the first connection layer 171 disposed on the second core layer 102 are attached and bonded to each other through the annealing process, the boundary between the first connection layers 171 may be unclear.

Thereafter, the third insulating layer 123 and the fourth insulating layer 124 may be further formed on the other surface of the first core layer 101 and the other surface of the second core layer 102, respectively, and the first circuit layer 151 and the second circuit layer 152 may be formed on the third insulating layer 123 and the fourth insulating layer 124, respectively. A plurality of third insulating layers 123 and a plurality of fourth insulating layers 124 may be formed, and a plurality of first circuit layers 151 and a plurality of second circuit layers 152 may be formed. Also, the plurality of insulating layers and the plurality of circuit layers may be alternately stacked. The number of the plurality of insulating layers and the number of the plurality of circuit layers may be freely adjusted if necessary, as described above for the printed circuit board according to an exemplary embodiment.

Figure 8A:
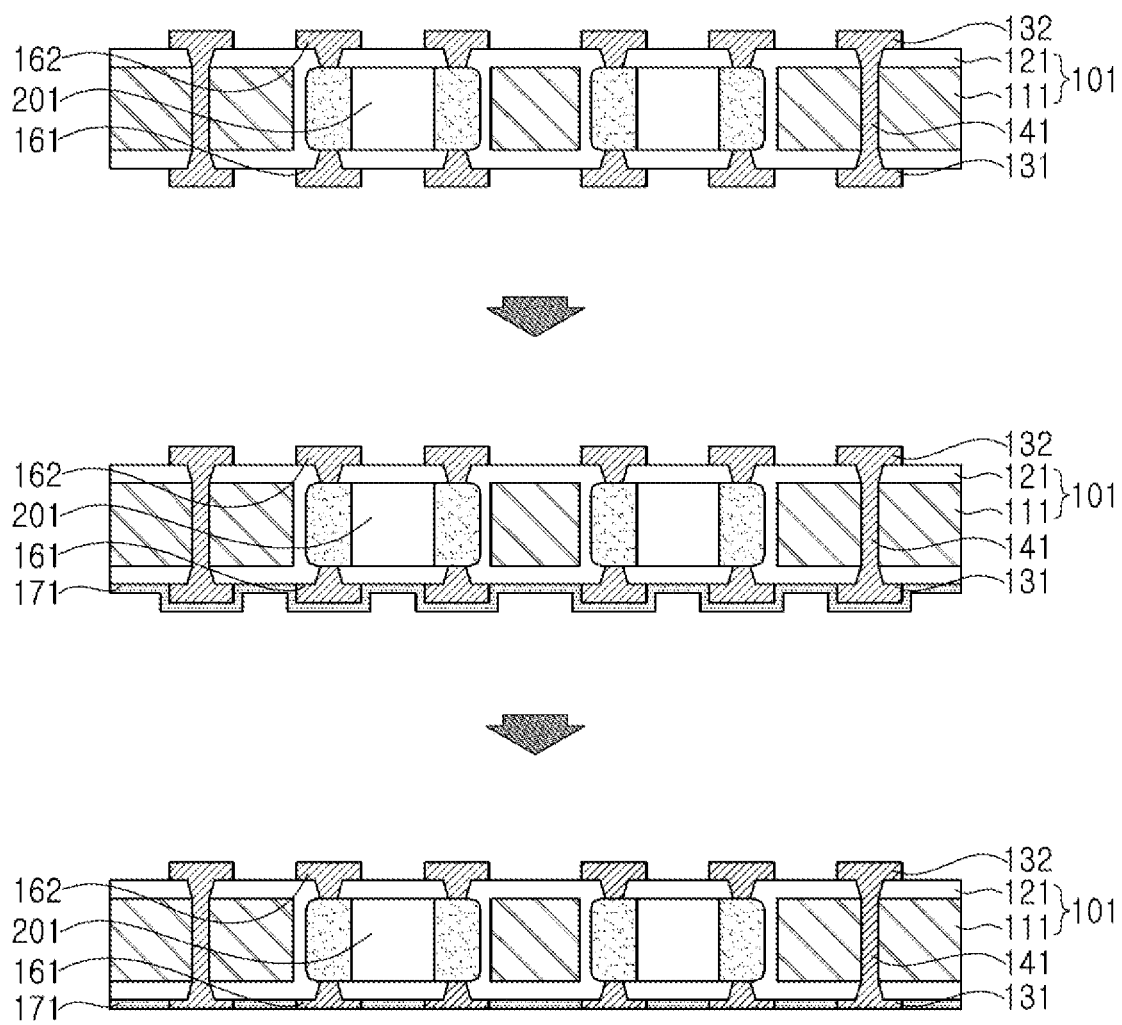
FIGS. 8A and 8B are schematic cross-sectional views illustrating a method of manufacturing the printed circuit board according to another exemplary embodiment.
Figure 8B:
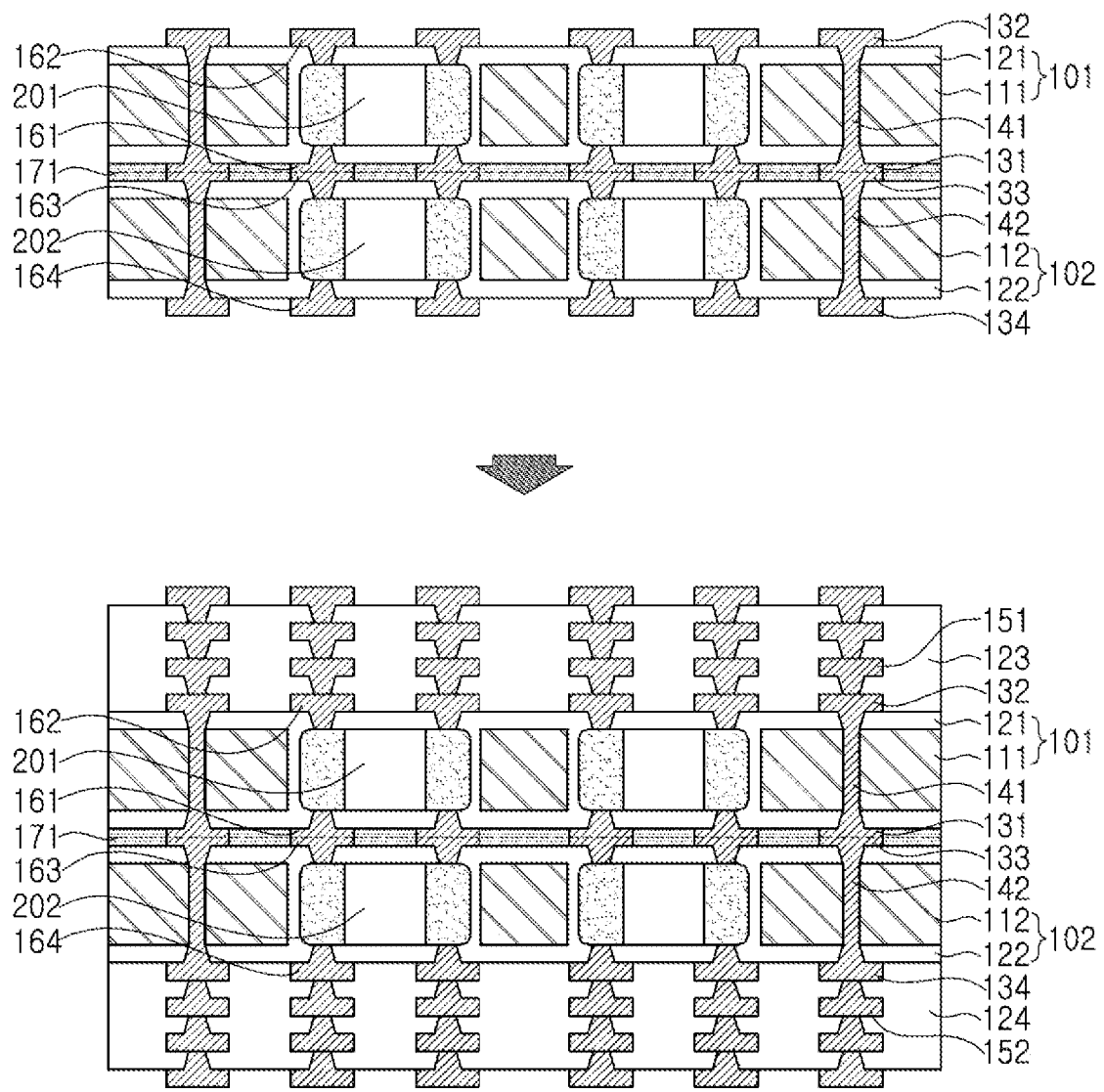

FIGS. 8A and 8B are schematic cross-sectional views illustrating a method of manufacturing the printed circuit board according to another exemplary embodiment.

Referring to FIG. 8A, the method of manufacturing the printed circuit board according to another exemplary embodiment may not include a step of forming a second connection layer 172 on the other surface of the first core layer 101. In a case where three or more core layers are stacked, the structure may be freely changed such that the second connection layers 172 are not formed on respective outward surfaces of the two outermost ones of the stacked core layers. That is, in the printed circuit board according to another exemplary embodiment, it should be noted that the second connection layers 172 are not formed on the other surfaces of the core layers, not the surfaces of the core layers connected to each other.

The other steps in the method of manufacturing the printed circuit board according to an exemplary embodiment may also be identically applied to the method of manufacturing the printed circuit board according to another exemplary embodiment. Therefore, the overlapping description thereof will not be repeated.

Figure 9A:
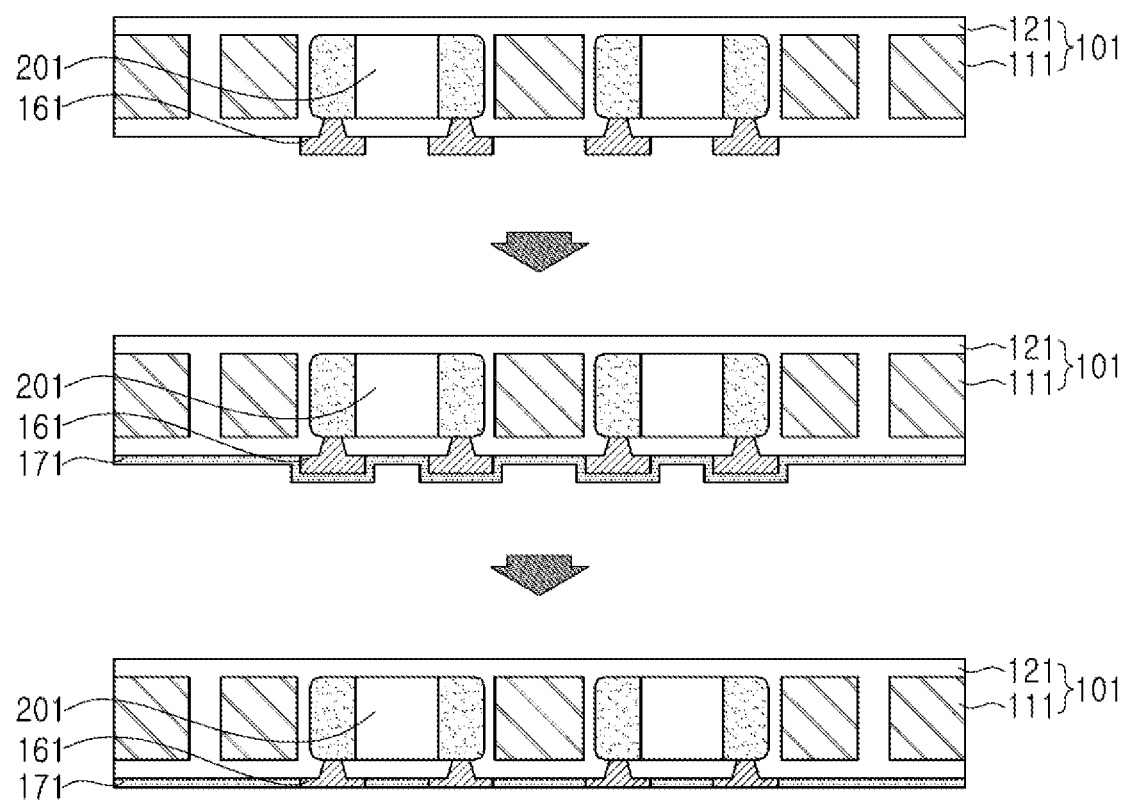
FIGS. 9A and 9B are schematic cross-sectional views illustrating a method of manufacturing the printed circuit board according to another exemplary embodiment.
Figure 9B:
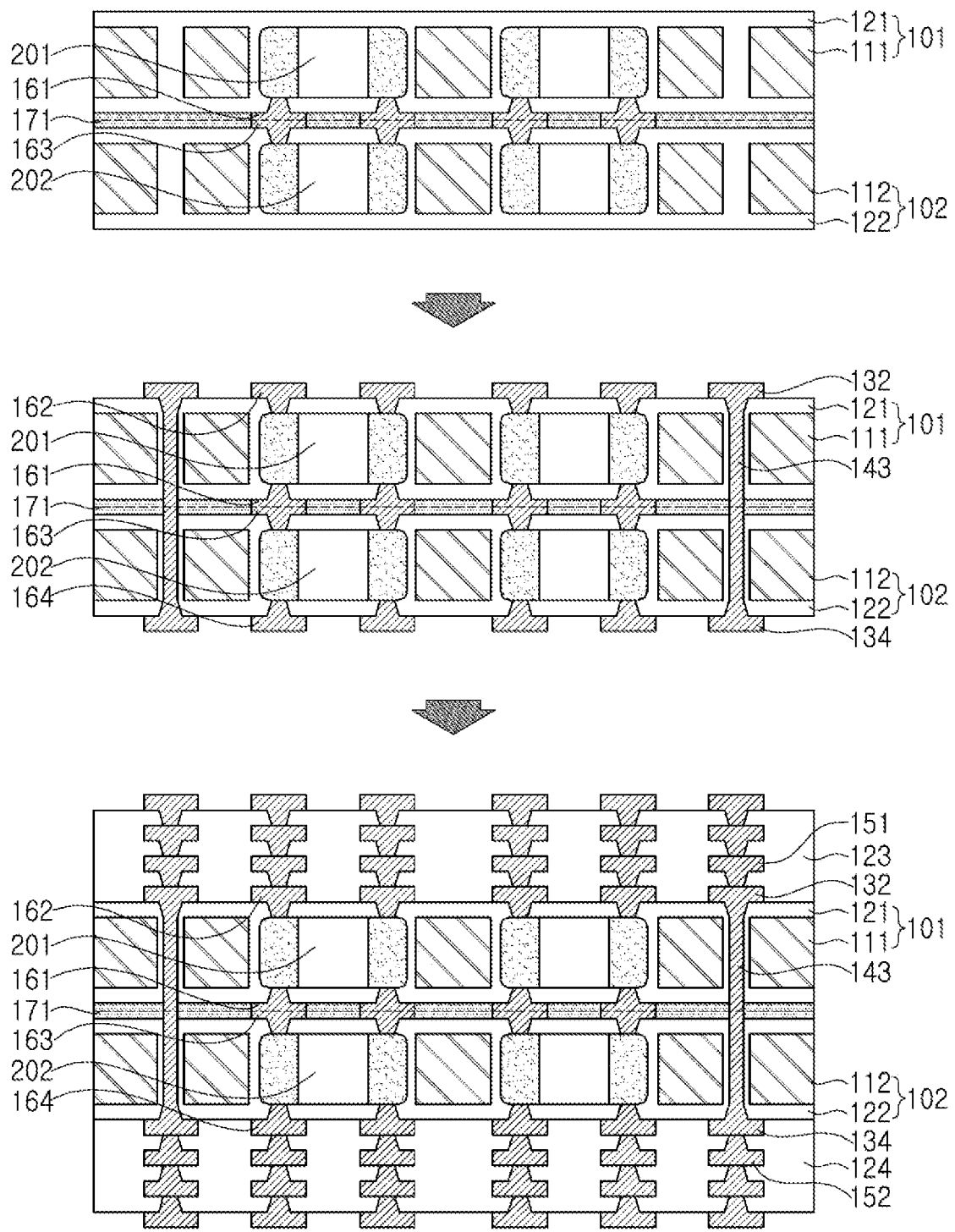

FIGS. 9A and 9B are schematic cross-sectional views illustrating a method of manufacturing the printed circuit board according to another exemplary embodiment.

Referring to FIG. 9A, the method of manufacturing the printed circuit board according to another exemplary embodiment may not include a step of forming a first via 141 penetrating through the first core layer 101. In a step of manufacturing the first core layer 101, a through hole penetrating through the first core 111 may be formed in advance in an area where the through via 143 is to be formed. That is, in the step of forming the cavity for mounting the first element 201 in the first core 111, the through hole may be formed.

Therefore, the second pad 162 and the second pattern 132 may not be formed in the step of forming the first core layer 101, and the second pad 162, the second pattern 132, and the through via 143 may be formed simultaneously after the plurality of core layers are combined to each other.

Referring to FIG. 9B, the second pad 162, the second pattern 132, and the through via 143 may be formed after one surface of the first core layer 101 and one surface of the second core layer 102 are connected to each other. Since the through hole areas of the first core layer 101 and the second core layer 102 are disposed to be aligned with each other when the first core layer 101 and the second core layer 102 are combined to each other, a new through hole may be formed to further penetrate through the insulating layers and the connection layers in addition to the through hole areas of the first core layer 101 and the second core layer 102 aligned with each other, and then, a through via may be formed in the new through hole by plating. To simplify the process, the second pad 162 and the second pattern 132 may be simultaneously formed with the through via. Meanwhile, although not illustrated in FIG. 9B, the forming of the second pad 162 on the other surface of the first core layer 101 may be performed before the first core layer 101 and the second core layer 102 are combined to each other. In a case where the first core layer 101 and the second core layer 102 are combined to each other after the second pad 162 is formed on the other surface of the first core layer 101, a step of forming the second pad 162 may be performed separately, which means that one more step is added to the process. As illustrated in FIG. 9B, it is preferable that the second pad 162 and the second pattern 132 are simultaneously formed with the through via 143 after the first core layer 101 and the second core layer 102 are combined to each other.

The other steps in the method of manufacturing the printed circuit board according to an exemplary embodiment or the method of manufacturing the printed circuit board according to another exemplary embodiment may also be identically applied to the method of manufacturing the printed circuit board according to another exemplary embodiment. Therefore, the overlapping description thereof will not be repeated.

Figure 10A:
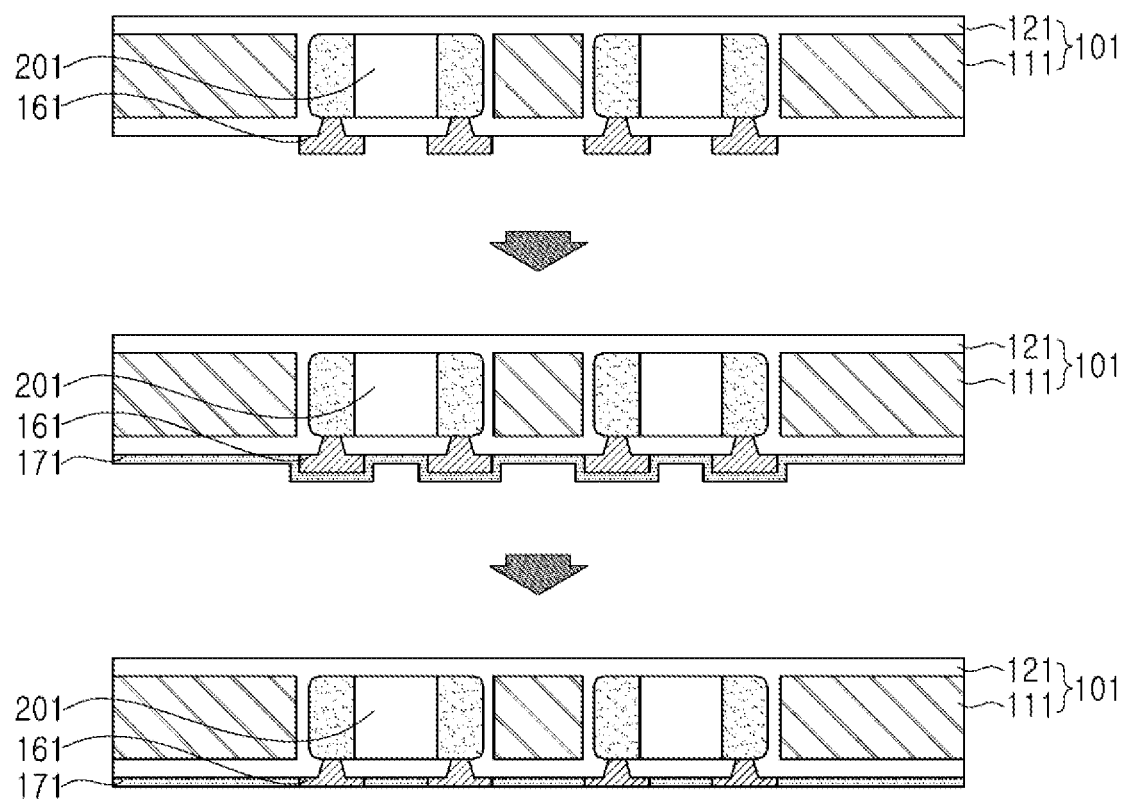
FIGS. 10A and 10B are schematic cross-sectional views illustrating a method of manufacturing the printed circuit board according to another exemplary embodiment.
Figure 10B:
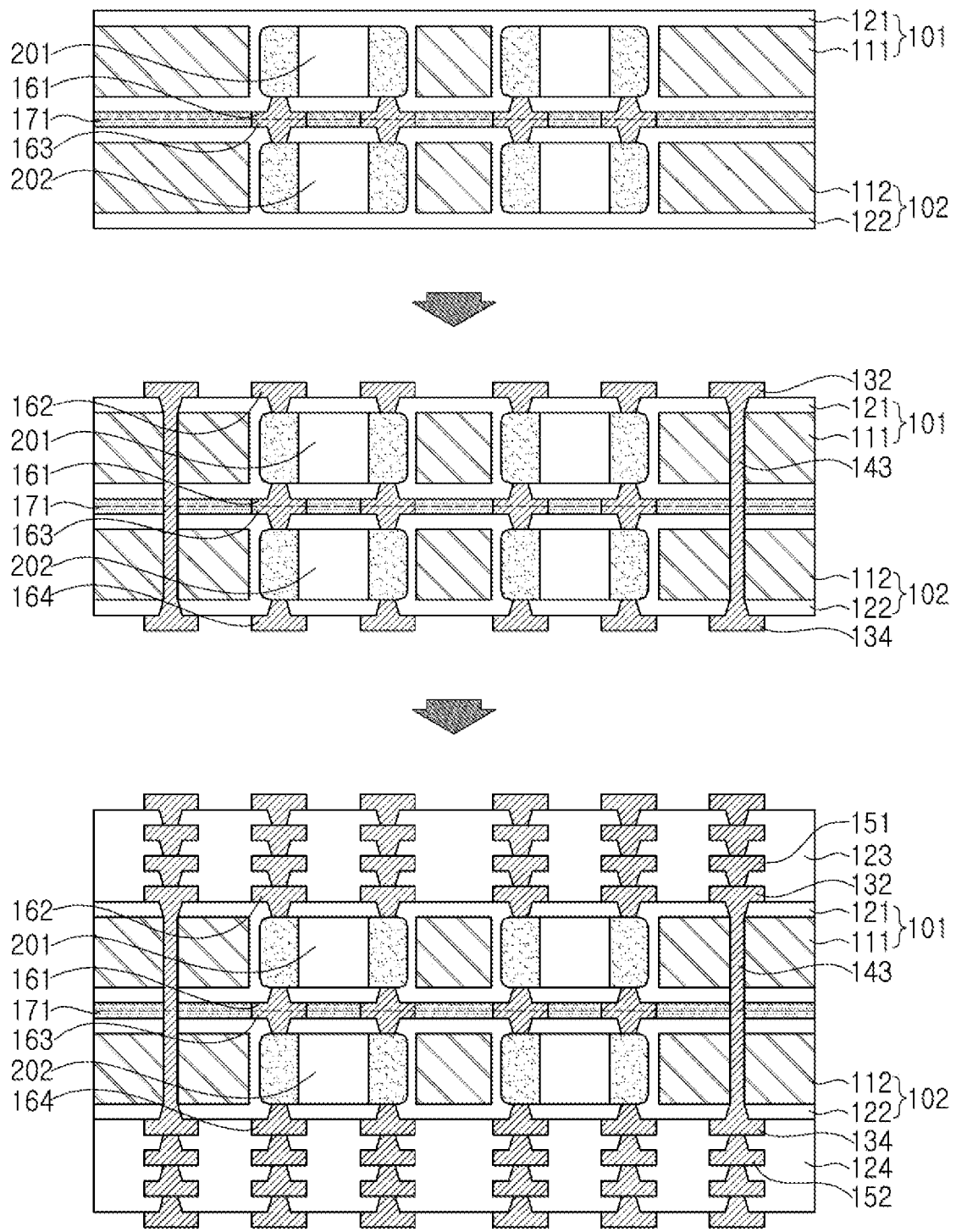

FIGS. 10A and 10B are schematic cross-sectional views illustrating a method of manufacturing the printed circuit board according to another exemplary embodiment.

Referring to FIG. 10A, the method of manufacturing the printed circuit board according to another exemplary embodiment may not include a step of forming a first via 141 penetrating through the first core layer 101, and may not include a step of forming a through hole penetrating through the first core 111 in advance in an area where the through via 143 is to be formed. That is, the method of manufacturing the printed circuit board according to another exemplary embodiment may include a step of mounting a first element 201 in the first core 111 and a step of forming a first pad 161 connected to the first element 201, and may include only a step of at least partially removing the first connection layer 171 after the first connection layer 171 is formed. Although not illustrated in FIG. 10A, the second pad 162 may be formed on the other surface of the first insulating layer 121 in the step of manufacturing the first core layer 101.

Referring to FIG. 10B, the second pad 162, the second pattern 132, and the through via 143 may be formed after one surface of the first core layer 101 and one surface of the second core layer 102 are connected to each other. After forming a through hole penetrating through all of the first core 111, the second core 112, the first insulating layer 121, the second insulating layer 122, and the first connection layers 171 in a lump, the through via 143 may be formed by plating. Since the through via 143 is formed after the first core layer 101 and the second core layer 102 are combined to each other, a side surface of the through via 143 may contact side surfaces of the first core 111 and the second core 112.

The other steps in the method of manufacturing the printed circuit board according to an exemplary embodiment, the method of manufacturing the printed circuit board according to another exemplary embodiment, or the method of manufacturing the printed circuit board according to another exemplary embodiment may also be identically applied to the method of manufacturing the printed circuit board according to another exemplary embodiment. Therefore, the overlapping description thereof will not be repeated.

As set forth above, according to the exemplary embodiments in the present disclosure, it is possible to provide a printed circuit board having a signal path in various ways for connection between electronic components or the like embedded in the printed circuit board, and a method of manufacturing the same.

In addition, it is possible to provide a printed circuit board in which a plurality of elements are embedded, and a method of manufacturing the same.

In addition, it is possible to provide a printed circuit board having improved reliability, and a method of manufacturing the same.

While exemplary embodiments have been shown and described above, it will be apparent to those skilled in the art that modifications and variations could be made without departing from the scope of the present invention as defined by the appended claims.

What is claimed is:

1. A printed circuit board comprising:
   a first core layer including a first insulating layer and a first core;
   a second core layer, disposed on the first core layer in a stacking direction, including a second insulating layer and a second core;
   a first element embedded in the first core;
   a second element embedded in the second core;
   a first pad and a second pad disposed on the first core layer and connected to the first element;
   a third pad and a fourth pad disposed on the second core layer and connected to the second element; and
   first connection layers interposed between one surface of the first core layer and one surface of the second core layer,
   wherein the first pad and the third pad contact each other,
   the first connection layers include at least one material of $SiO_2$, SiN, or SiCN, and
   at least one of the first or third pad respectively extends from a surface of the first or second element in the stacking direction with an increasing width.

2. The printed circuit board of claim 1, wherein the first pad and the third pad are embedded in the first connection layers.

3. The printed circuit board of claim 1, wherein the first pad has a smaller thickness than the second pad.

4. The printed circuit board of claim 3, wherein the third pad has a smaller thickness than the fourth pad.

5. The printed circuit board of claim 1, further comprising:
   a first pattern and a second pattern disposed on the one surface and the other surface of the first core layer, respectively; and
   a third pattern and a fourth pattern disposed on the one surface and the other surface of the second core layer, respectively,
   wherein the first pattern and the third pattern contact each other.

6. The printed circuit board of claim 5, wherein the first pattern and the third pattern are embedded in the first connection layers.

7. The printed circuit board of claim 6, further comprising:
   a first via penetrating through the first core layer to connect the first pattern and the second pattern to each other; and
   a second via penetrating through the second core layer to connect the third pattern and the fourth pattern to each other.

8. The printed circuit board of claim 1, further comprising:
   a third insulating layer disposed on the other surface of the first core layer;
   a fourth insulating layer disposed on the other surface of the second core layer;
   a first circuit layer disposed on one surface of the third insulating layer; and
   a second circuit layer disposed on one surface of the fourth insulating layer.

9. The printed circuit board of claim 1, further comprising a second connection layer disposed on the other surface of the first core layer to cover the first insulating layer and the second pad,
   wherein the second connection layer includes at least one material of $SiO_2$, SiN, or SiCN.

10. The printed circuit board of claim 9, further comprising a third connection layer disposed on the other surface of the second core layer to cover the second insulating layer and the fourth pad,
    wherein the third connection layer includes at least one material of $SiO_2$, SiN, or SiCN.

11. The printed circuit board of claim 1, further comprising:
- patterns disposed on the other surface of the first core layer and the other surface of the second core layer, respectively; and
- a through via connecting the patterns to each other, and penetrating through the first core layer, the second core layer, and the first connection layers.

12. The printed circuit board of claim 11, where the through via is in contact with the first connection layers and is spaced apart from the first core layer and the second core layer.

13. The printed circuit board of claim 11, where the through via is in contact with the first core layer, the second core layer, and the first connection layers.

14. The printed circuit board of claim 1, wherein the first element and the second element include a passive component.

15. A printed circuit board comprising:
- a first core layer including a first insulating layer and a first core;
- a second core layer, disposed on the first core layer in a stacking direction, including a second insulating layer and a second core;
- a first passive component disposed in the first core and covered by the first insulating layer;
- a second passive component disposed in the second core and covered by the second insulating layer; and
- a connection pad disposed between the first passive component and the second passive component, connected to the first passive component through a first via extending in the first insulating layer from the connection pad to the first passive component, and connected to the second passive component through a second via extending in the second insulating layer from the connection pad to the second passive component,
- wherein at least one of the first or second via respectively extends from a surface of the first or second passive component in the stacking direction with an increasing width.

16. The printed circuit board of claim 15, further comprising an insulating connection layer disposed between the first insulating layer and the second insulating layer.

17. The printed circuit board of claim 16, wherein the insulating connection layer includes a material different from the first insulating layer and the second insulating layer.

18. The printed circuit board of claim 16, further comprising:
- a through via penetrating through the first insulating layer, the first core layer, the insulating connection layer, the second insulating layer, and the second core layer to connect patterns respectively disposed on the first insulating layer and the second insulating layer.

19. The printed circuit board of claim 15, wherein the first via and the second via are tapered in opposite directions.

20. The printed circuit board of claim 15, wherein the connection pad includes a first pad and a second pad, and
- the first pad and the second pad are in contact with each and are misaligned in a stacking direction of the first pad and the second pad.

* * * * *